(12) United States Patent
Cui et al.

(10) Patent No.: US 10,371,740 B2
(45) Date of Patent: Aug. 6, 2019

(54) POWER SYSTEM DISTURBANCE LOCALIZATION USING RECURRENCE QUANTIFICATION ANALYSIS AND MINIMUM-VOLUME-ENCLOSING ELLIPSOID

(71) Applicant: University of Tennessee Research Foundation, Knoxville, TN (US)

(72) Inventors: Yi Cui, Knoxville, TN (US); Feifei Bai, Macgregor (AU); Wenxuan Yao, Knoxville, TN (US); Yong Liu, Knoxville, TN (US); Ling Wu, Knoxville, TN (US); Yilu Liu, Knoxville, TN (US)

(73) Assignee: University of Tennessee Research Foundation, Knoxville, TN (US)

( * ) Notice: Subject to any disclaimer, the term of this patent is extended or adjusted under 35 U.S.C. 154(b) by 203 days.

(21) Appl. No.: 15/609,861

(22) Filed: May 31, 2017

(65) Prior Publication Data

US 2018/0348287 A1    Dec. 6, 2018

(51) Int. Cl.
| | | |
|---|---|---|
| *G01R 31/08* | (2006.01) | |
| *G06F 17/18* | (2006.01) | |
| *H02H 1/00* | (2006.01) | |
| *G06Q 50/06* | (2012.01) | |
| *G05F 1/66* | (2006.01) | |

(52) U.S. Cl.
CPC ......... *G01R 31/086* (2013.01); *G01R 31/088* (2013.01); *G05F 1/66* (2013.01); *G06Q 50/06* (2013.01); *H02H 1/0092* (2013.01)

(58) Field of Classification Search
CPC .. G01R 31/025; G01R 31/086; G01R 31/088; G05F 1/66; G06Q 50/06; H02H 1/0092
USPC ................ 702/59, 60, 75; 340/524; 455/446
See application file for complete search history.

(56) References Cited

U.S. PATENT DOCUMENTS

| | | | | |
|---|---|---|---|---|
| 2007/0247303 A1* | 10/2007 | Payton | ................... | G01D 21/00 340/524 |
| 2018/0167833 A1* | 6/2018 | Barnickel | ............. | H04W 4/027 |

OTHER PUBLICATIONS

Wang et al., "A Method to Analyze Power System Quality Disturbing Signal Based on Recurrence Quantification Analysis." Procedia Engineering, vol. 15, (2011), pp. 4115-4121.
(Continued)

*Primary Examiner* — John H Le
(74) *Attorney, Agent, or Firm* — Myers Bigel, P.A.

(57) ABSTRACT

A method for determining a location of a disturbance in a power system is provided. The method includes receiving data from a plurality of sensors distributed across the power system; performing a recurrence quantification analysis on the received data to identify a predetermined number of sensors, from the plurality of sensors, that are closest to the disturbance; constructing a plurality of minimum-volume-enclosing ellipsoids based on and enclosing the data received from the identified sensors; extracting one or more parameters from the plurality of minimum-volume-enclosing ellipsoids; inputting the one or more parameters into a multivariate-random-forest regression algorithm to determine the location of the disturbance and a power mismatch corresponding to the disturbance; and presenting, on one or more display units, the determined location of the disturbance and the determined power mismatch.

20 Claims, 12 Drawing Sheets

(56) References Cited

OTHER PUBLICATIONS

Bi et al., "A novel hybrid state estimator for including synchronized phasor measurements." Electric Power Systems Research vol. 78, (2008), pp. 1343-1352.
Mohammadi et al., "A Robust Initialization Algorithm for k-Means Clustering in Power Distribution Networks with PMU-based Adaptive Protection System." Department of Electrical Engineering, University of Texas. IEEE, 2014, 4 pages.
Girgis et al., "Adaptive Estimation of Power System Frequency Deviation and its Rate of Change for Calculating Sudden Power System Overloads." IEEE Transactions on Power Delivery, vol. 5, No. 2, Apr. 1990, pp. 585-594.
Gopakumar et al., "Adaptive fault identification and classification methodology for smart power grids using synchronous phasor angle measurements." IET Generation Transmission Distribution, 2015, vol. 9, Iss. 2, pp. 133-145.
Zhang et al., "Adaptive Online Disturbance Location Considering Anisotropy of Frequency Propagation Speeds." IEEE Transactions on Power Systems, vol. 31, No. 2, Mar. 2016, pp. 931-941.
Jiang et al., "An Adaptive PMU Based Fault Detection/Location Technique for Transmission Lines Part I: Theory and Algorithms." IEEE Transactions on Power Delivery, vol. 15, No. 2, Apr. 2000, pp. 486-493.
Dong et al., "Analysis of Power System Disturbances Based on Wide-Area Frequency Measurements." IEEE, 2007, 8 pages.
Bhui et al., "Application of Recurrence Quantification Analysis to Power System Dynamic Studies." IEEE Transactions on Power Systems, vol. 31, No. 1, Jan. 2016, pp. 581-591.
Düstegör et al., "Automated Graph-Based Methodology for Fault Detection and Location in Power Systems." IEEE Transactions on Power Delivery, vol. 25, No. 2, Apr. 2010, pp. 638-646.
Ma et al., "Building Decision Trees for Characteristic Ellipsoid Method to Monitor Power System Transient Behaviors." IEEE, 2010, 8 pages.
Mei et al., "Clustering-Based Dynamic Event Location Using Wide-Area Phasor Measurements." IEEE Transactions on Power Systems, vol. 23, No. 2, May 2008, pp. 673-679.
Rovnyak et al., "Dynamic event detection and location using wide area phasor measurements." European Transactions Electrical Power, 2011, vol. 21, pp. 1589-1599.
Markham et al., "Electromechanical Speed Map Development using FNET/GridEye Frequency Measurements." IEEE, 2014,5 pages.
Dahal et al., "Event stream processing for improved situational awareness in the smart grid." Expert Systems with Applications, vol. 42, (2015), pp. 6853-6863.
Luo et al., "Frequency Deviation of Thermal Power Plants Due to Wind Farms." IEEE Transactions on Energy Conversion, vol. 21, No. 3, Sep. 2006, pp. 708-716.
Yin et al., "Initial Investigation of Data Mining Applications in Event Classification and Location Identification Using Simulated Data from MinniWECC." IEEE, 2016, 6 pages.
Pandey et al., "Large Power Network Signature Analysis with PMU Signal-Dynamic Clustering Approach." IEEE UP Section Conference on Electrical Computer and Electronics, 2015, 6 pages.
Bai et al., "Measurement-based correlation approach for power system dynamic response estimation." IET Generation Transmission Distribution, 2015, vol. 9, Iss. 12, pp. 1474-1484.
Preston et al., "New settings-free fault location algorithm based on synchronised sampling." IET Generation Transmission Distribution, 2011, vol. 5, Iss. 3, pp. 376-383.
Breiman, "Random Forests." Machine Learning, vol. 45, 2001, pp. 5-32.
Marwan et al., "Recurrence plots for the analysis of complex systems." Physics Reports vol. 438, (2007), pp. 237-329.
Eckmann et al., "Recurrence Plots of Dynamical Systems." Europhysics Letters, vol. 4 No. 9, (1987), pp. 973-977.
Schinkel et al., "Selection of recurrence threshold for signal detection." European Physical Journal Special Topics, vol. 164, (2008), pp. 45-53.
Radojevic et al., "Smart Overhead Lines Autoreclosure Algorithm Based on Detailed Fault Analysis." IEEE Transactions on Smart Grid, vol. 4, No. 4, Dec. 2013, pp. 1829-1838.
Ma et al., "The Characteristic Ellipsoid Methodology and its Application in Power Systems." IEEE Transactions on Power Systems, vol. 27, No. 4, Nov. 2012, pp. 2206-2214.
Ma et al., "Use Multi-Dimensional Ellipsoid to Monitor Dynamic Behavior of Power Systems Based on PMU Measurement." IEEE, 2008, 8 pages.
Ma et al., "Wave-Front Arrival Time Analysis Using Wide-Area Frequency Measurements." IEEE, 2009, 5 pages.
Xia et al., "Wide-area Frequency Based Event Location Estimation." IEEE, 2007, 7 pages.
Liu et al., "Wide-Area-Measurement System Development at the Distribution Level: An FNET/GridEye Example." IEEE Transactions on Power Delivery, vol. 31, No. 2, Apr. 2016, pp. 721-731.
Ye, Yanzhu, "Wide-area Situational Awareness Application Developments." PhD dissertation, University of Tennessee, 2011. http://trace.tennessee.edu/utk_graddiss/1251.

* cited by examiner

POWER SYSTEM DISTURBANCE LOCALIZATION USING RECURRENCE QUANTIFICATION ANALYSIS AND MINIMUM-VOLUME-ENCLOSING ELLIPSOID

STATEMENT REGARDING FEDERALLY SPONSORED RESEARCH OR DEVELOPMENT

This invention was made with government support under EEC-1041877 awarded by the U.S. National Science Foundation and the U.S. Department of Energy. The U.S. Government has certain rights in this invention.

BACKGROUND

The present disclosure generally relates to electric power systems and disturbance localization in electric power system.

Severe electromechanical disturbances in a power system, such as generator outage and load shedding, can significantly affect the system dynamic behaviors and put the system stability under threat. Therefore, it is important to perform disturbance detection and localization to understand the nature of the disturbance and to maintain a stable operation of the power system.

Disturbance detection may be enabled by installing a number of sensors at different locations in the power system. The electrical parameters of the power system, such as voltage and current, measured by the sensors may then be aggregated to monitor the disturbances and dynamic behaviors of the system. The fundamental of disturbance detection is that large disturbances typically cause severe deviations in voltage and frequency. Such dynamics have propagation characteristic that varies in time and space. However, due to the low sampling rate of the data recorded by conventional supervisory control and data acquisition (SCADA) system, historically, an accurate real time disturbance detection and localization has not been easy to achieve.

With the development of sensor technology, synchrophasor-based wide-area measurement system (WAMS) provides real-time awareness of power system dynamics. For example, based on high resolution data recorded by phasor measurement units (PMUs), dynamic characteristics of electrical parameters during different disturbances, e.g., short-circuit tripping, generator tripping, and load reduction, have been investigated. Correlations between disturbance features (such as disturbance location, type, and severity) and typical characteristics of corresponding frequency dynamics have been studied at length. Other methods dedicated to the improvement of disturbance identification, such as offline hierarchical clustering and hybrid state estimators, have also been studied.

Conventional disturbance localization methods typically include two steps. The first step is to obtain response times of PMUs and the second step is to estimate the location of the disturbance from the response times. To obtain response times, for each PMU, most methods calculate a time delay of arrival (TDOA) based on when its frequency or phase angle measurement exceeds a predefined threshold. The disturbance location may then be estimated by using a least square optimization to minimize the estimated distance error as in equation $$\min \sum_{i=1}^{n} \left[ (\varphi_i - \varphi_d)^2 + (\chi_i - \chi_d)^2 - v^2 (t_i - t_d)^2 \right]^2 \quad (1)$$

s.t.

$\varphi_{min} < \varphi_d < \varphi_{max}$ $\chi_{min} < \chi_d < \chi_{max}$ $0 < t_d < t_i, \forall i \in \{1, 2, \ldots, n\}$ In equation (1), n denotes the number of PMUs used to estimate the disturbance location, $(\varphi_i, \chi_i)$ and $(\varphi_d, \chi_d)$ respectively denote Lambert projection coordinates of the $i^{th}$ PMU and the real disturbance location, v denotes the propagation speed of the electromechanical wave, $t_d$ denotes the start time of the disturbance and $t_i$ denotes the wave-front arrival time of $i^{th}$ PMU.

Although extensive studies have been carried out to improve the efficiency of disturbance detection methods, performing accurate disturbance identification has proven to be challenging due to assumptions that may lead to substantial errors in estimating the disturbance location. For example, most studies assume that all buses in a power system are equipped with PMUs and that the voltage and frequency at each bus are free of noise. Most studies also assume that the propagation speed of a disturbance is identical and constant in every direction, regardless of the changes in network topology and/or load conditions of the system. However, these assumptions do not always hold true.

Therefore, the inventors recognized a need in the art for systems and methods for accurately and reliably determining the location of a disturbance in an electric power system.

DETAILED DESCRIPTION

An embodiment of the present disclosure provides a method for determining a location of a disturbance in a power system is provided. The method includes receiving data from a plurality of sensors distributed across the power system; performing a recurrence quantification analysis on the received data to identify, from the plurality of sensors, a predetermined number of sensors that are closest to the disturbance; constructing a plurality of minimum-volume-enclosing ellipsoids based on and enclosing the data received from the identified sensors; extracting one or more parameters from the plurality of minimum-volume-enclosing ellipsoids; inputting the one or more parameters into a multivariate-random-forest regression algorithm to determine the location of the disturbance and a power mismatch corresponding to the disturbance; and presenting, on one or more display units, the determined location of the disturbance and the determined power mismatch; and presenting, on one or more display units, the determined location of the disturbance.

Another embodiment of the present disclosure provides a system including a power system, a plurality of sensors distributed across the power system, and a computer system. The computer system includes one or more processors, one or more display units, and memory storing instructions adapted to be executed by the plurality of processors to perform the method for determining a location of a disturbance in the power system.

Figure 1:
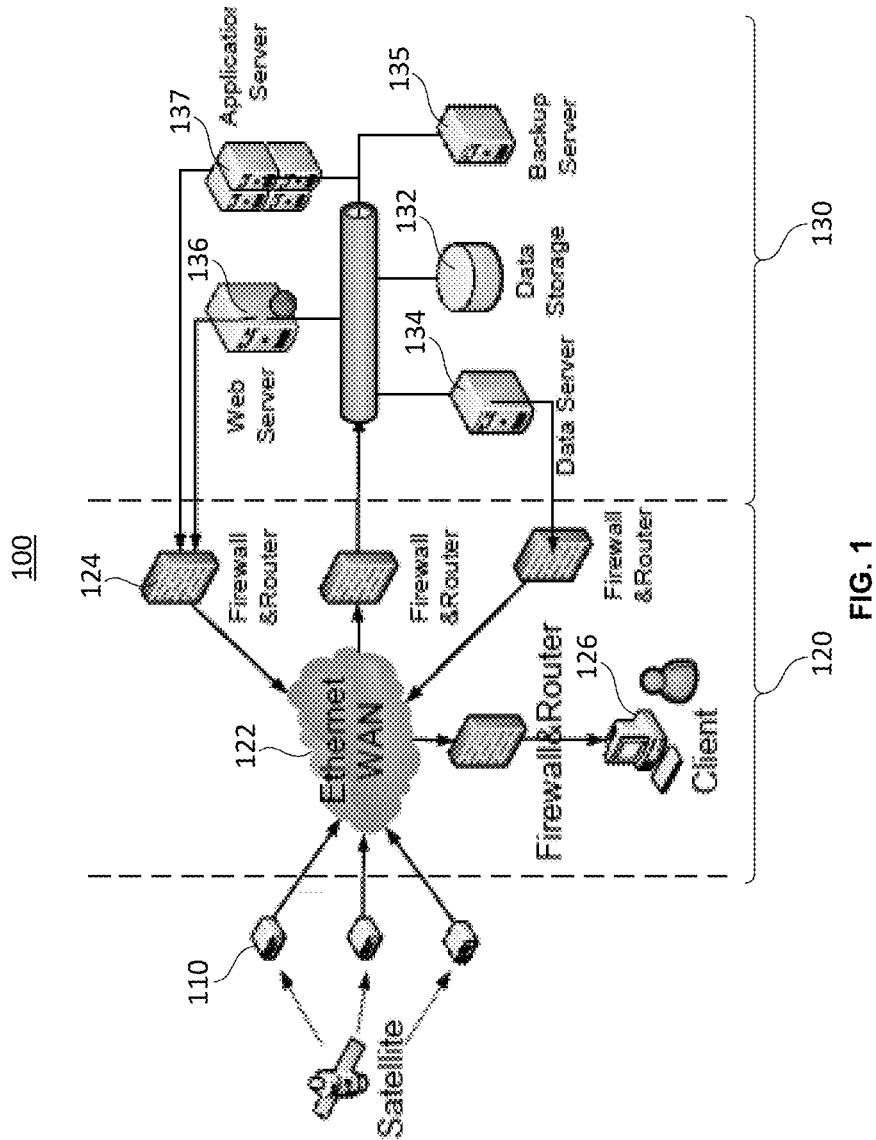
FIG. 1 illustrates an exemplary framework of a monitoring network for a power system, according to an embodiment of the present disclosure.

FIG. 1 illustrates an exemplary framework of a monitoring network 100 for a power system, according to an embodiment of the present disclosure. The network 100 may consist of one or more phasor measurement units (PMUs) 110, which may perform local global positioning system (GPS)-synchronized measurements and send data to an information management system (IMS) 130 through the Internet 120.

The PMUs 110 are typically sparsely installed to perform local measurements at different locations across the power system. The PMUs 110 generally include voltage and/or current sensors to make voltage and/or current measurements. The PMUs 110 may include one or more processors and memory storing instructions to be executed by the one or more processors to determine the frequency, phase angle, etc. of the voltage and/or current measurements locally. It is to be appreciated that the PMUs 110 are not limited to any particular device, and may refer to any sensor that uses synchrophasor measurement technology. Each PMU 110 may include a GPS receiver providing a GPS-based synchronization signal (e.g., pulse per second (PPS), inter-range instrumentation group B (IRIG-B)), which may be used for sampling control in the PMU 110.

The Internet 120 may serve as a wide-area communication network (WAN) 122 with a plurality of firewalls/routers 124 to connect the PMUs 110 and one or more clients 126 to the IMS 130. The IMS 130 may collect the sampled measured data and/or the computed data from the PMUs 110, store the data in databases in data storage devices 132, and provide a platform for analyses of the data either before or after storing the data. The servers 134-137 in the IMS 130 may include a plurality of processors to manipulate and analyze the stored data serially and/or in parallel. The servers 134-137 may be centrally or distributedly located. Data generated from the analyses of the stored data may also be stored in the data storage devices 132. The data storage devices 132 may include secondary or tertiary storage to allow for non-volatile or volatile storage of the measured, computed, and generated data. The IMS 130 may be entirely contained at one location or may also be implemented across a closed or local network, an internet-centric network, or a cloud platform.

The IMS 130 may provide the measured and/or computed data, either before or after storing the data, to the one or more clients 126. Alternatively, the sampled measured data and/or the computed data may be transmitted directly from the PMUs 110 to the clients 126 via the Internet 120. The data received at the clients 126 may be displayed on one or more displays and/or further manipulated by one or more processors for analysis, monitoring, and control of the power system either automatically by computer systems or visually and manually by one or more operators of the power system. Based on the synchrophasor data, one or more devices/equipment such as generators, transformers, switches, capacitors, transmission lines, power-consuming loads, etc. in the power system may be controlled automatically by the computer systems or manually by the one or more operators, in order to maintain the stability and safe operation of the power system.

Figure 2:
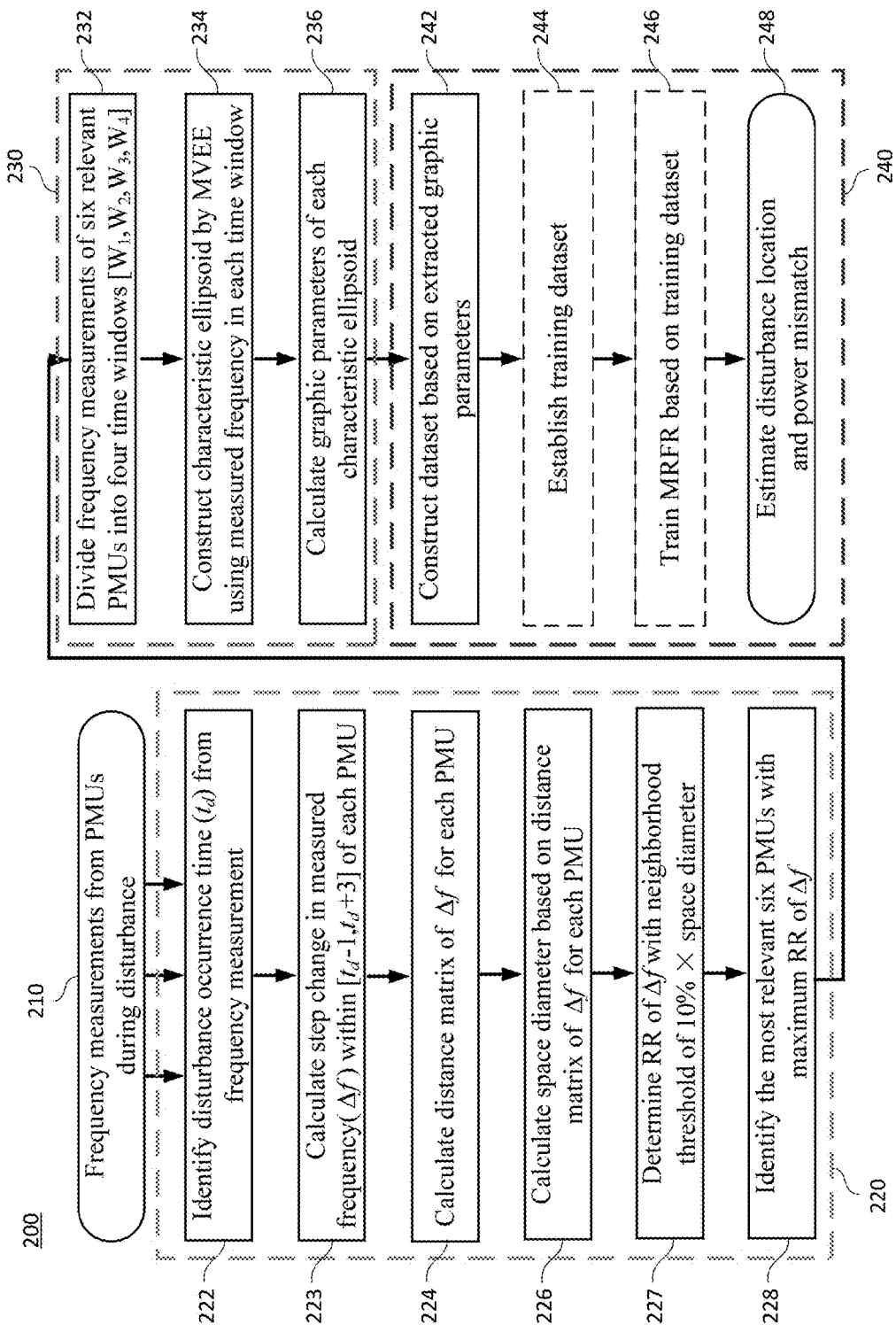
FIG. 2 is a flowchart depicting a method for determining a location of a disturbance in a power system, according to an embodiment of the present disclosure.

FIG. 2 is a flowchart depicting a method 200 for determining a location of a disturbance in a power system, according to an embodiment of the present disclosure. The method 200 starts at step 210 with frequency measurements received from a plurality of PMUs (e.g., the PMUs 110 in FIG. 1). Alternatively, the frequency measurements may be received from one or more databases of an IMS (e.g., the IMS 130 in FIG. 1). Then, based on the frequency measurements, the method 200 performs a first routine 220, using a recurrence quantification analysis (RQA), to identify a predetermined number of PMUs (e.g., six PMUs) that are close to the disturbance. Using frequency measurements from the identified PMUs, the method 200 performs a second routine 230 to construct one or more minimum-volume-enclosing ellipsoids (MVEEs) from which graphic parameters are extracted. Finally, the method 200 performs a third routine 240 to estimate the location of the disturbance by feeding the calculated graphic parameters into a multivariate-random-forest regression (MRFR). In performing the third routine 240, the method 200 may also estimate a power mismatch corresponding to the disturbance. Steps taken by the method 200 in the routine 220, 230, and 240 will be described below.

Recurrence Quantification Analysis

The method 200 performs the first routine 220, using a RQA, to identify a predetermined number of PMUs that are close to the disturbance. RQA aims at examining whether states of a dynamic system have the capability to revisit samples in a phase space trajectory. RQA has been widely used to evaluate the periodicity and recurring nature of a non-stationary system. In RQA, form states of a system $X=[\bar{x}_1, \bar{x}_2, \ldots m\ \bar{x}_i, \bar{x}_m]$, an Euclidean distance between any two measured state vectors $(\bar{x}_i, \bar{x}_j)$ in X is calculated as $d_{i,j}=\|\bar{x}_i, \bar{x}_j\|$ and stored in a distance matrix D as in equation (2).

$$D = \begin{bmatrix} d_{1,1} & \cdots & d_{1,m} \\ \vdots & \ddots & \vdots \\ d_{m,1} & \cdots & d_{m,m} \end{bmatrix} \quad (2)$$

Based on the distance matrix D, an element $R_{i,j}$ of a recurrence matrix R may be determined as in equation (3), where $\Theta(\cdot)$ denotes the Heaviside step function given in equation (4). Any two vectors on the phase space trajectory are considered to be recurrent only if the distance between them is below a neighborhood threshold $\delta$.

$$R_{i,j}(\delta) = \Theta(\delta - d_{i,j}) = \Theta(\delta - \|\bar{x}_i - \bar{x}_j\|) \quad i,j = 1 \ldots m \quad (3)$$

-continued $$\Theta(t) = \begin{cases} 1 & t \geq 0 \\ 0 & t < 0 \end{cases} \quad (4)$$

From equations (3) and (4), it can be seen that the recurrence matrix R consists of binary (zero and one) elements. To quantify the periodicity of a signal, various quantitative metrics may be derived from the recurrence matrix. For example, a recurrence rate RR is used hereinafter. The recurrence rate RR is calculated as a density of the recurrence points in the recurrence matrix R and expressed as in equation (5).

$$RR = \frac{1}{m^2} \sum_{i,j=1}^{m} R_{i,j} \quad (5)$$

To identify a predetermined number of PMUs that are close to a disturbance, for each PMU, RQA may be implemented on a step change $\Delta f$ in the frequency measured by the PMU when the disturbance occurs.

Figure 3:
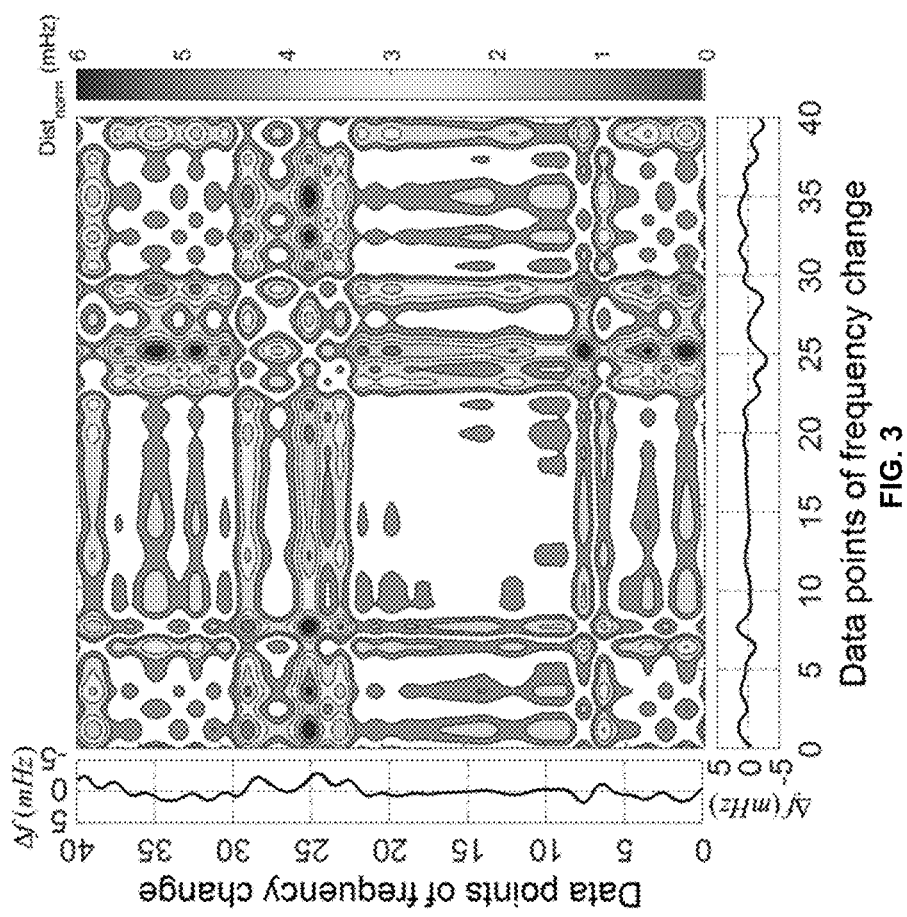
FIG. 3 illustrates an exemplary contour map of a distance matrix of frequency step change measured by a phasor measurement unit (PMU) during a disturbance.
Figure 4A:
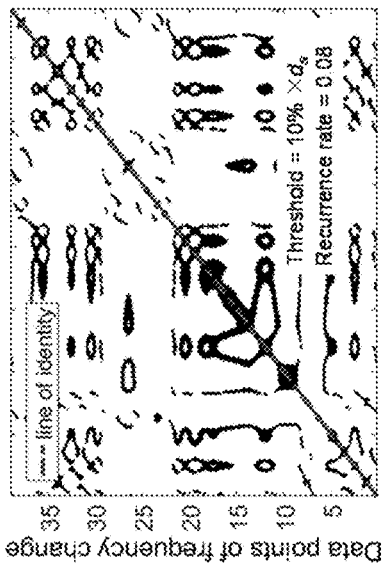
FIGS. 4A-4D illustrate exemplary plots of recurrence matrices corresponding to the distance matrix in FIG. 3, with different neighborhood thresholds.
Figure 4B:
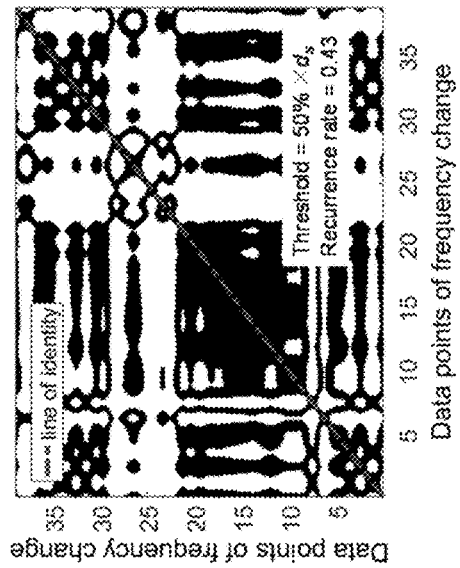
Figure 4C:
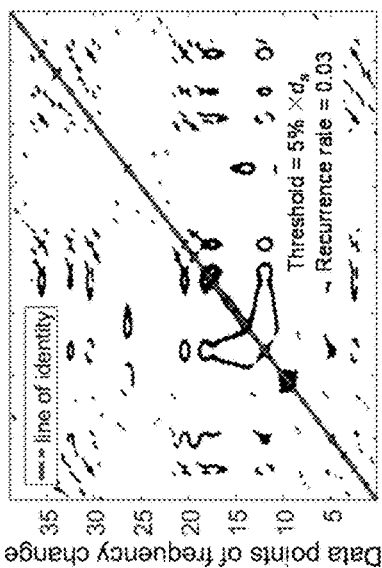
Figure 4D:
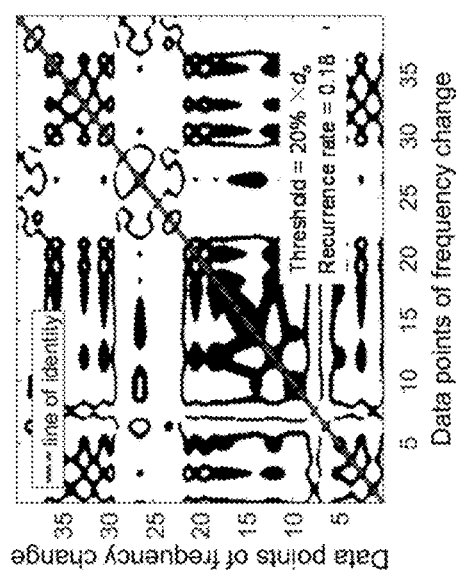

Referring back to FIG. 2, at step 222, the method 200 first identifies an occurrence time $t_d$ of the disturbance from frequency measurements from one or more PMUs from step 210. For example, the method may calculate a rate of change of frequency from one or more PMUs using a moving time window and determine the occurrence time $t_d$ of the disturbance when the rate of change of frequency exceeds a predefined threshold value. Then, at step 223, for each PMU, the method 200 calculates the step change $\Delta f$ in frequency data recorded over a time period that includes the occurrence time $t_d$; for example, within 1 second before and 3 seconds after the occurrence time $t_d$. The frequency step change $\Delta f$ is calculated as the difference between every two subsequent recorded frequency data points, for example, by subtracting the measured frequency at a preceding time instance from a latter one. The calculated frequency step change $\Delta f$ may be normalized as zero-mean with standard deviation to compute, at step 224, each element in a distance matrix D as in equation (2). FIG. 3 illustrates an exemplary contour map of a distance matrix D of frequency step change $\Delta f$ measured by a PMU during a disturbance.

At step 226, for each PMU, the method 200 calculates a space diameter $d_s$ of a space defined by the distance matrix D. With a neighborhood threshold $\delta$ set at a predetermined percentage (e.g., 10% in FIG. 2) of the space diameter $d_s$, the method 200 calculates a recurrence rate RR of the frequency step change $\Delta f$ for each PMU at step 227 using equations (3)-(5). FIGS. 4A-4D illustrate exemplary plots of recurrence matrices R corresponding to the distance matrix D in FIG. 3, with neighborhood threshold $\delta$ set at 5%, 10%, 20% and 50% of the space diameter $d_s$, respectively. In FIGS. 4A-4D, the recurrence points $(x_i, x_j)$ with distance $d_{i,j}$ less than the corresponding neighborhood threshold $\delta$ are marked as black dots. Generally, in the plots of recurrence matrices R, large diagonals which repeat themselves periodically represent the periodicity of the signal, while stochastic signals usually result in very short or absent diagonals. Since any sample is necessarily recurrent itself as $d_{i,j}=0$, the longest diagonal in each of FIGS. 4A-4D is defined as a line of identity. The recurrence rates RR, calculated as in equation (5), are shown on FIGS. 4A-4D. As can be seen, an increase in the neighborhood threshold $\delta$ results in an increase in the recurrence rate RR. This is due to the fact that more samples are considered as recurrent points when a higher neighborhood threshold $\delta$ is used in equation (3).

Once a recurrence rate RR is calculated for each PMU at step 227 using a neighborhood threshold $\delta$ set at a predetermined percentage of the space diameter $d_s$ corresponding to the distance matrix D of the PMU, the method 200 identifies/selects a predetermined number of PMUs with the highest recurrence rates RR at step 228. The number of PMUs selected may be chosen based on the desired accuracy and computational efficiency in estimating the disturbance location. For example, six PMUs with the highest recurrence rates RR may be selected.

Figure 5:
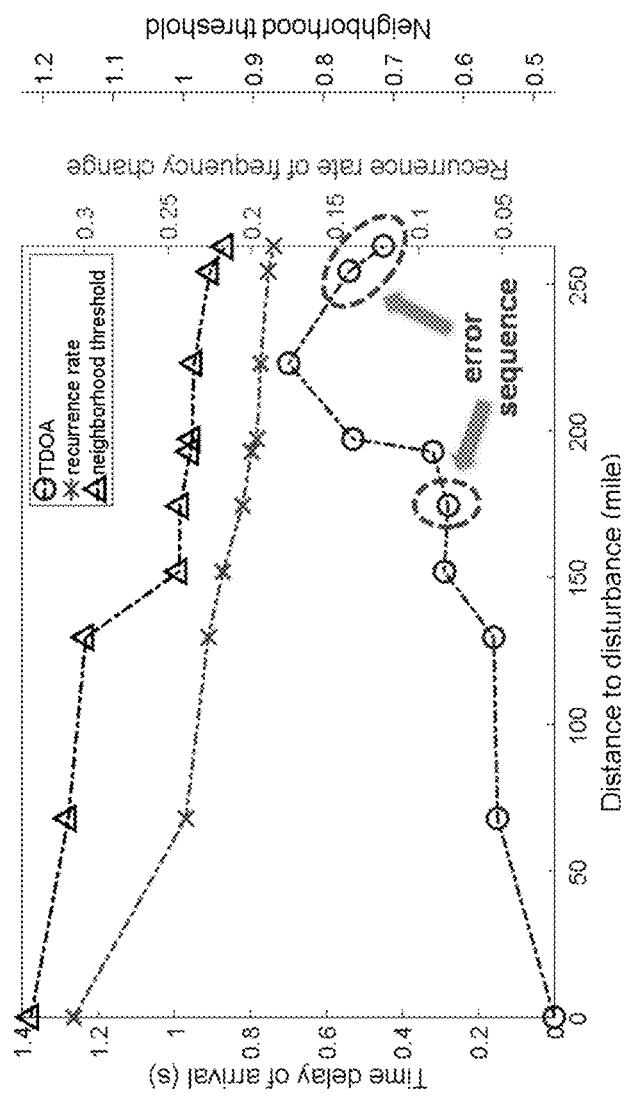
FIG. 5 illustrates a plot of exemplary recurrence rates for ten PMUs closest to a disturbance, along with their corresponding neighborhood thresholds.

FIG. 5 illustrates a plot of exemplary recurrence rates RR for ten PMUs closest to a disturbance, with corresponding neighborhood thresholds $\delta$ set at 10% of the space diameter $d_s$. FIG. 5 also illustrates, for each of the ten PMUs, a time delay of arrival (TDOA), which is computed using a conventional angle-based method, wherein the TDOA is determined as the time at which a detrended phase angle measurement from the PMU exceeds a predefined threshold.

As can be seen from FIG. 5, there is a monotonic decrease in recurrence rate RR as the distance of the PMU from the disturbance increases. A similar trend can be observed in the neighborhood thresholds $\delta$. This is due to the fact that when a disturbance-induced electromechanical wave propagates through a power system, the frequency measured by the PMU closest to the disturbance undergoes sharp variations first. As the recurrence rate is calculated by the step change in frequency $\Delta f$ rather than the frequency itself, the phase space (for calculating the recurrence) also increases due to the large variation in frequency. This causes an increase in the neighborhood threshold $\delta$ of the phase space, which thus results in a growth in recurrence rate. Therefore, the PMU, which is closest to the disturbance location, has the highest recurrence rate RR.

On the other hand, while the TDOA is expected to increase with distance from the disturbance, this is not generally the case. As can be seen in FIG. 5, the TDOA of the four PMUs closest to the disturbance location show a monotonic increasing trend. However, for some PMUs (identified as "error sequence" in FIG. 5), the TDOA decreases as they get farther away from the disturbance location. As such, the use of recurrence rate RR determined by RQA, rather than TDOA, may improve the accuracy of disturbance location estimation in a power system.

Minimum-Volume-Enclosing Ellipsoid

Figure 6:
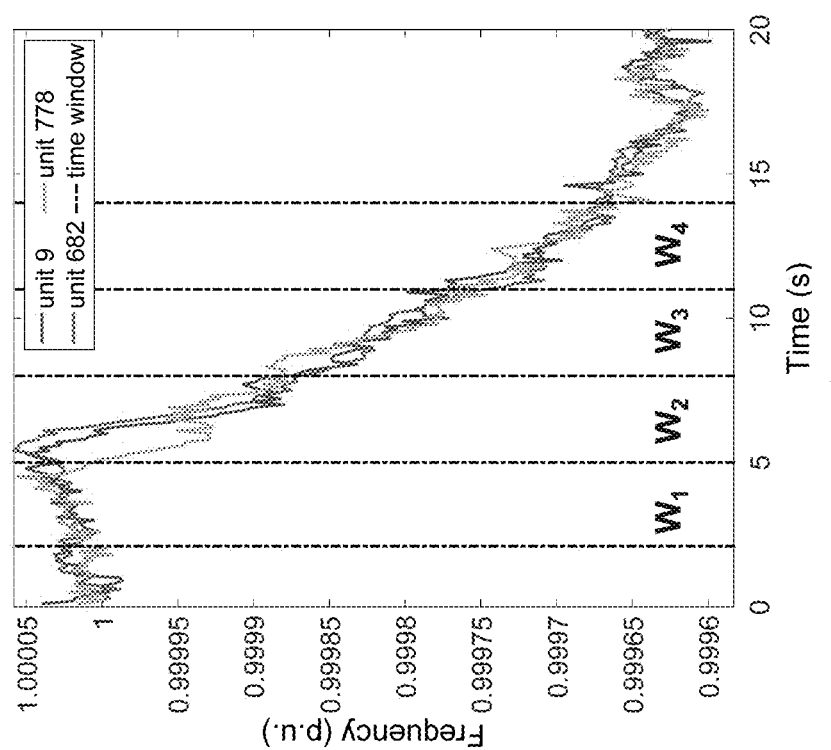
FIG. 6 shows exemplary normalized frequency measurements, divided into four time windows, from three PMUs closest to a disturbance.

Once a predetermined number of PMUs are selected from the first routine 220, the method 200 performs the second routine 230 to construct one or more MVEEs, based on frequency measurements received from these selected PMUs and from which graphic parameters may be extracted. Hereinafter, for example, the number of PMUs selected will be six (i.e., the six PMUs closest to the disturbance in FIG. 5). For ease of illustration, however, FIG. 6 shows exemplary normalized frequency measurements from three (units 9, 682, and 778) of the six PMUs closest to the disturbance, which started at 5 seconds. At step 232, the method 200 divides the frequency data into four time windows $W_1$-$W_4$, which cover the majority time span of the disturbance event, as shown in FIG. 6. The width of each of the time windows $W_1$-$W_4$ is selected as, but is not limited to, three seconds. The time window $W_1$ contains three seconds of frequency measurement before the disturbance, while the remaining three time windows $W_2$-$W_4$ contain frequency measurements following the disturbance.

At step 234, the method 200 constructs a MVEE using the frequency data in each time window. A MVEE is typically used to monitor the status of a system and estimate its dynamic behaviors by interpreting graphic parameters of a plurality of multi-dimensional closed ellipsoids. Such an ellipsoid, with minimum volume, is established by enclosing a part of the system trajectory in the phasor measurement space. The construction of the ellipsoid may be formulated as enclosing most recent phasor measurement points $\theta=[\theta_1, \theta_2, \ldots, \theta_m]$, $\theta_i \in \Omega''$m where $\Omega''$ denotes an n-dimensional phasor measurement space, within an MVEE. Here, n may be treated as the number of different phasor measurements. The ellipsoid may be determined as in equation (6), where a vector c denotes the center of the ellipsoid, and the shape and orientation of the ellipsoid is determined by a positive definite ellipsoid matrix A.

$$H_{A,c} = \{\theta \in \Omega'' | (\theta-c)^T A (\theta-c) \le 1\} \quad (6)$$

Constructing the ellipsoid may be achieved by solving a dual optimization problem to maximize the square root of the determinant of A (i.e., det(A)), subjected to $c \in \Omega''$. Once the dual optimization problem is solved, the ellipsoid may be constructed by using the ellipsoid matrix A and the center vector c. Then, a series of graphic parameters of the ellipsoid, such as volume, center vectors, projections of the semi axes, as well as their time derivatives, may be calculated to describe the states and dynamics of the system.

Figure 7:
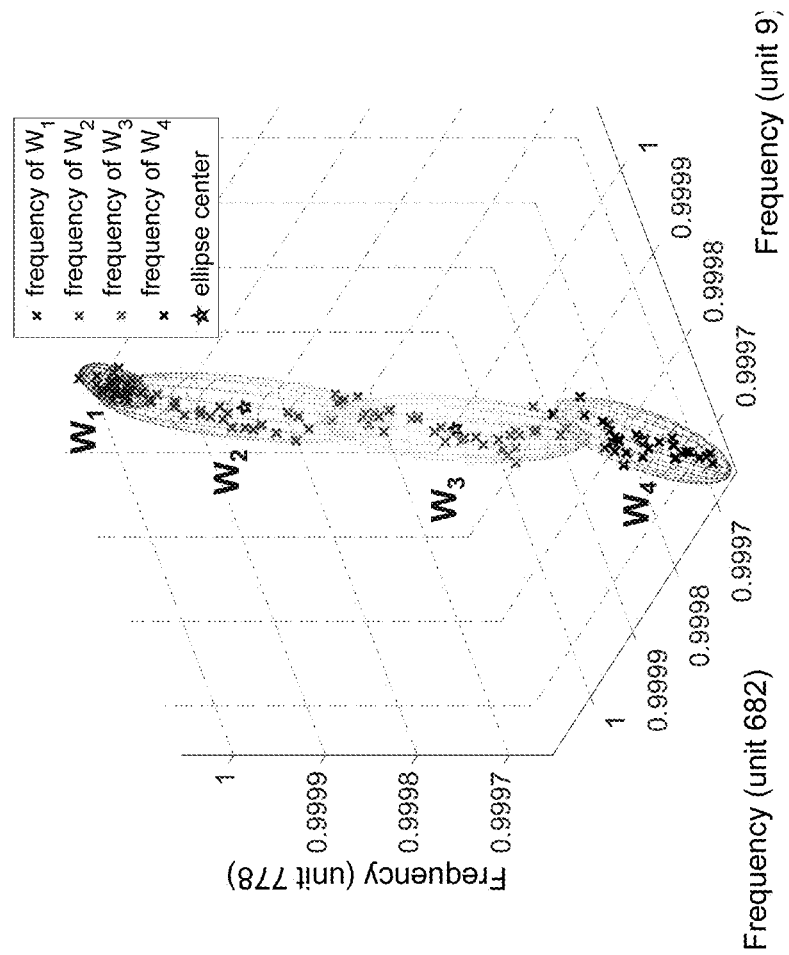
FIG. 7 shows four minimum-volume-enclosing ellipsoids corresponding to the frequency measurements in FIG. 6.

For ease of illustration (i.e., three PMUs in three dimensions, rather than six PMUs in six dimensions), FIG. 7 shows four MVEEs corresponding to the frequency data points from the three PMUs 9, 682, and 778 in the four time windows $W_1$-$W_4$ in FIG. 6. From FIG. 7, it can be seen that the volume, centre, and orientation of each of the four ellipsoids are dictated by the frequency data within the specific time window.

Figure 8:
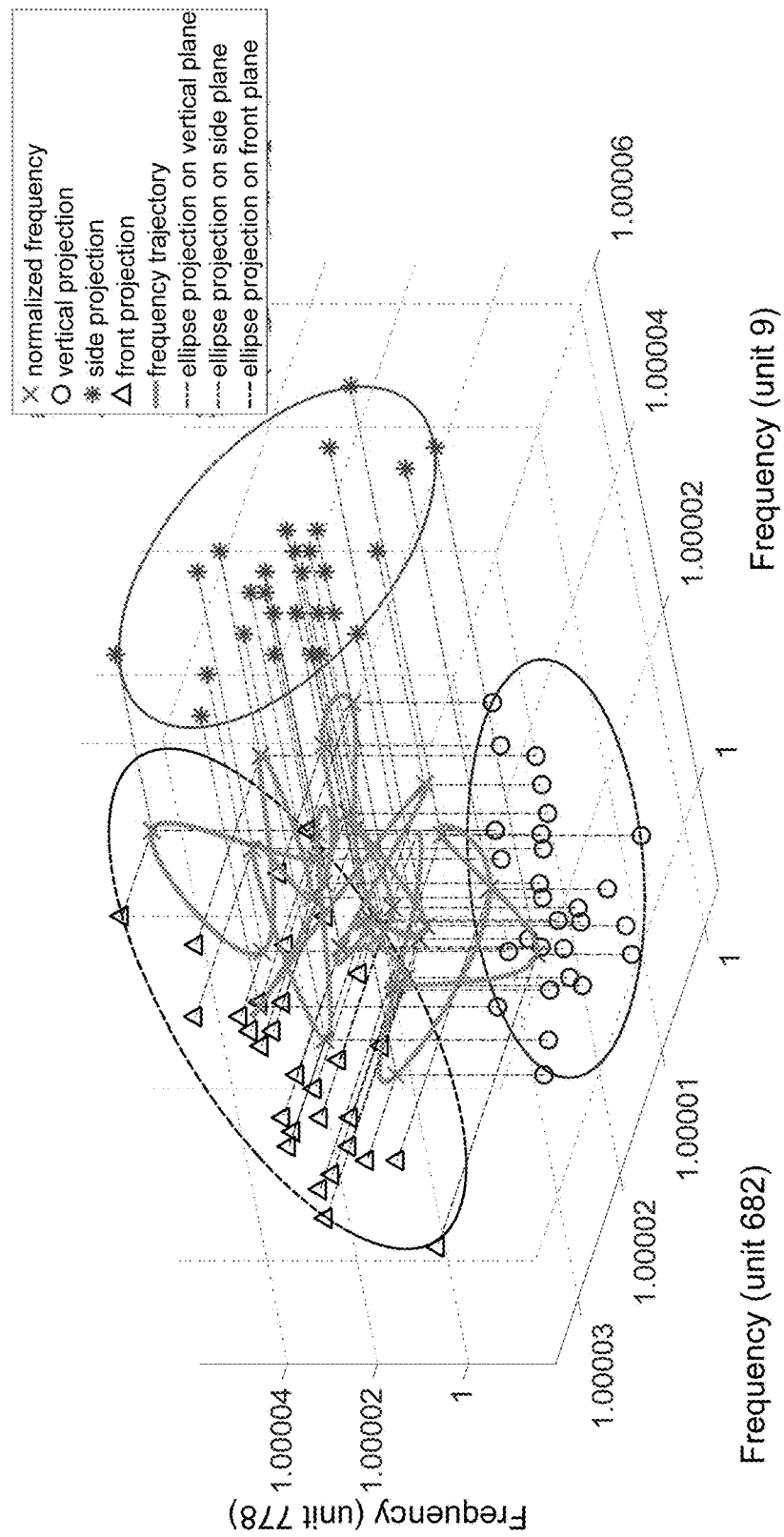
FIG. 8 shows a frequency trajectory and projections of the minimum-volume-enclosing ellipsoid in a time window in FIG. 6.

FIG. 8 shows a frequency trajectory and projections of the ellipsoid in time window $W_1$ (before the disturbance). From FIG. 8, it can be observed that the projection of the frequency data in each dimension resides within the projected boundaries of the ellipsoid, ensuring that the minimal volume may be attained for the ellipsoid.

From the constructed ellipsoids, the method 200 calculates graphic parameters of each ellipsoid at step 236. For example, Table I summarizes the graphic parameters of each ellipsoid in each time window for each of the three PMUs 9, 682, and 778. From Table I, it can be seen that there is a significant increase in the volume from time window $W_1$ (before disturbance) to time window $W_2$ (when disturbance occurs). Generally, the volume of an ellipsoid represents the stress of a system within a specific time interval. A high magnitude in the volume indicates the system is becoming more stressed. Such phenomenon may also be observed from the time derivative of the volume, wherein a positive time derivative of the volume implies that the system is becoming less stable. Moreover, the centers of the ellipsoids show a decreasing trend after the disturbance. This is because the centers of the ellipsoids are calculated as the average of the maximum and minimal samples from the corresponding measurements within the time window. In addition, the projection of the semi axes of unit 9 in time window $W_2$ attains the highest magnitude among all three units. This indicates unit 9 has the largest variation in the measured frequency during the disturbance.

TABLE I

| Graphic parameters | | Before disturbance $W_1$ | After disturbance $W_2$ | After disturbance $W_3$ | After disturbance $W_4$ |
|---|---|---|---|---|---|
| Volume ($\times 10^{-14}$) | | 5.1 | 108 | 38 | 25 |
| Centers | Unit 9 | 1 | 1 | 0.9998 | 0.9997 |
| | Unit 682 | 1 | 1 | 0.9998 | 0.9997 |
| | Unit 778 | 1 | 0.9999 | 0.9998 | 0.9997 |
| Projection of the semi axes ($\times 10^{-6}$) | Unit 9 | -26 | 124 | 59 | 67 |
| | Unit 682 | -8.6 | 113 | 64 | 36 |
| | Unit 778 | -24 | 61 | 95 | 55 |

Table II summarizes the feature decomposition of the frequency ellipsoids measured by the six PMUs closest to the disturbance (including units 9, 682, and 778). A total of 85 features may be extracted—73 graphic parameters extracted from the ellipsoids and 12 coordinates of the locations of the six PMUs.

TABLE II

| Features | Dimensions (time window × PMUs) |
|---|---|
| Volume | 4 |
| Centers | 4 × 6 = 24 |
| Projection of the longest axis | 4 × 6 = 24 |
| Time derivative of volume | 3 |
| Time derivative of centers | 3 × 6 = 18 |
| Longitude/latitude of relevant PMUs | 2 × 6 = 12 |
| Total dimension | 85 |

Multivariate-Random-Forest Regression

Once the graphic parameters are calculated at step 236, the method 200 constructs at step 242 a dataset, which is based on the extracted graphic parameters and which is fed into a MRFR of the third routine 240 to estimate the disturbance location. Additionally, in the third routine 240, the method 200 may estimate a power mismatch corresponding to the disturbance.

An MRFR is an ensemble of regression trees that are trained by bootstrap sampling and random feature selection. An MRFR aims at building a large collection of regression trees, and averages the output of each tree so as to reduce the variance of prediction results and boost the performance of the final model. The advantages of an MRFR are that it has a high robustness to the input data and it can overcome an over-fitting problem during the training process, which may lower the prediction accuracy of the algorithm.

Figure 9:
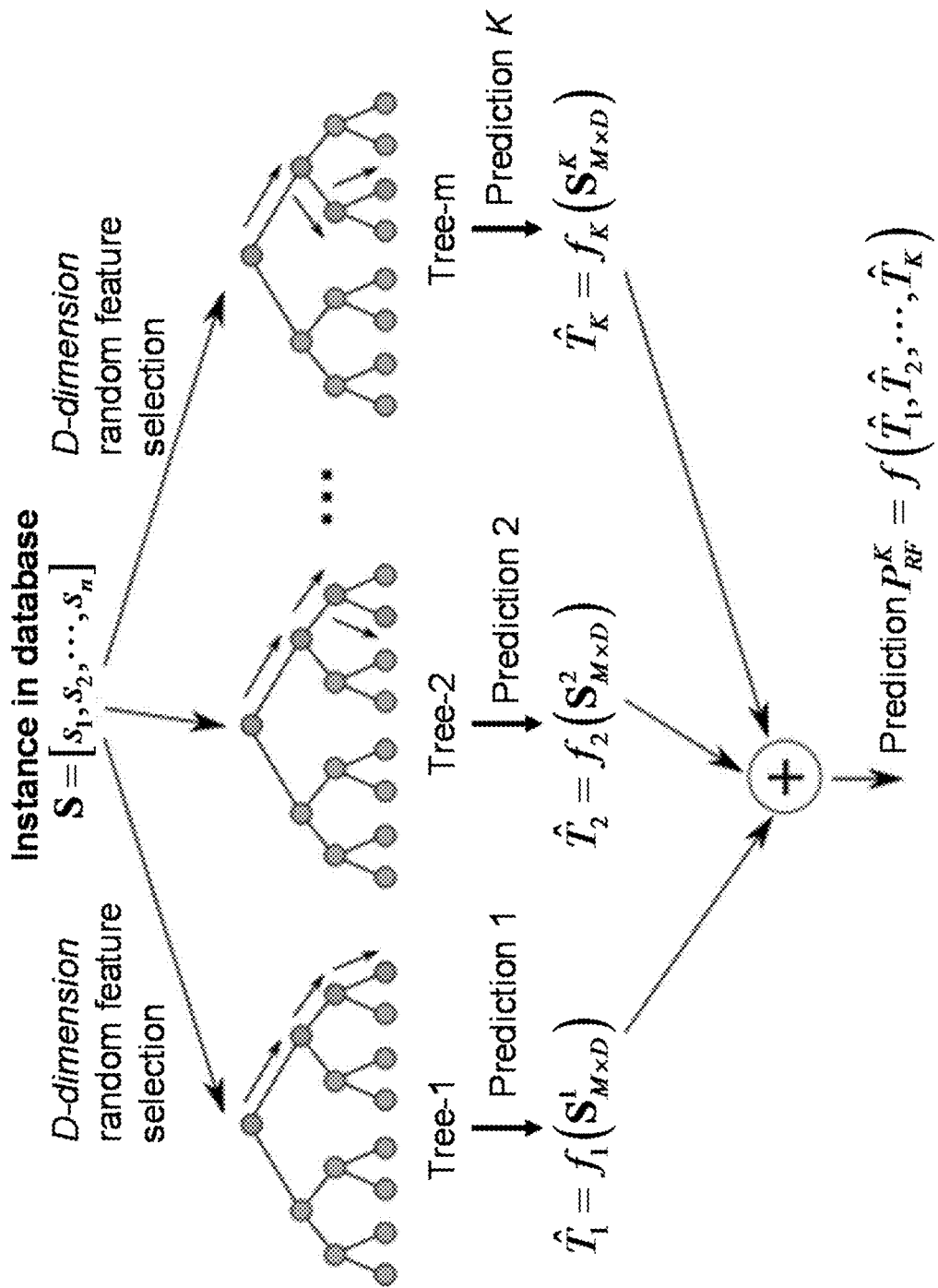
FIG. 9 shows a diagram of an exemplary multivariate-random-forest regression algorithm.

FIG. 9 shows a diagram of an exemplary MRFR algorithm. Given a training dataset $S=[s_1, s_2, \ldots, s_n]$ and a corresponding response $P=[p_1, p_2, \ldots, p_n]$, the MRFR algorithm first draws a bootstrap sample of size M from the training dataset. Then, a regression tree $\hat{T}_i$ is established based on the bootstrapped data, by recursively repeating the following two steps for each terminal node of the tree, until a minimum node size is reached: (1) randomly select a predefined dimension of features of each bootstrapped sample in the training dataset, and (2) split the parent node into two children nodes based on an information gain ratio criterion and a Gini index, as known in the art.

Accordingly, if the MRFR has not previously been trained or needs to be updated, the method 200 establishes a training dataset at step 244, using historical PMU data related to known disturbances, for example. The method 200 then trains the MRFR based on the training dataset at step 246. Training targets of the MRFR may include three groups/ outputs—a longitude of the disturbance, a latitude of the disturbance, and a power mismatch associated with the disturbance—which are all known given the historical nature of the data. At step 246, the MRFR is trained to learn the underlying relationship between the input features (listed in Table II) and the target values of each of the three groups.

For example, a dataset containing features extracted from thousands of historical disturbance measurements may be divided into a training sub-dataset (70% samples) and a testing sub-dataset (30% samples). Then ten-fold cross-validation may be performed on the training sub-dataset to determine optimal parameters of the MRFR algorithm, including the total tree number of the forest, minimal leaves of each regression tree, and number of features which may be randomly selected by each tree. After finding the optimal values of the above parameters, the MRFR algorithm may be trained on the whole training sub-dataset.

If the MRFR has been trained and does not need to be updated, the method 200 may skip steps 244 and 246, and performs step 248. At step 248, the method 200 performs the iterative procedure for K times and the output of the forest is the average of the predictions from each regression tree as in equation (7). For instance, at step 248, the dataset constructed at step 242 based on the graphic parameters extracted at step 236 is fed into the trained MRFR algorithm to estimate the coordinates (longitude and latitude) of the disturbance and the associated power mismatch.

$$P_{RF}^{K} = \frac{1}{K}\sum_{i=1}^{K}\hat{T}_i(s) \quad (7)$$

The above procedures (dataset separation, cross validation, training/testing) may be repeated for a number of times (e.g., 100 times) and an averaged estimation error may be recorded as evaluation metrics.

Case Studies

Figure 10A:
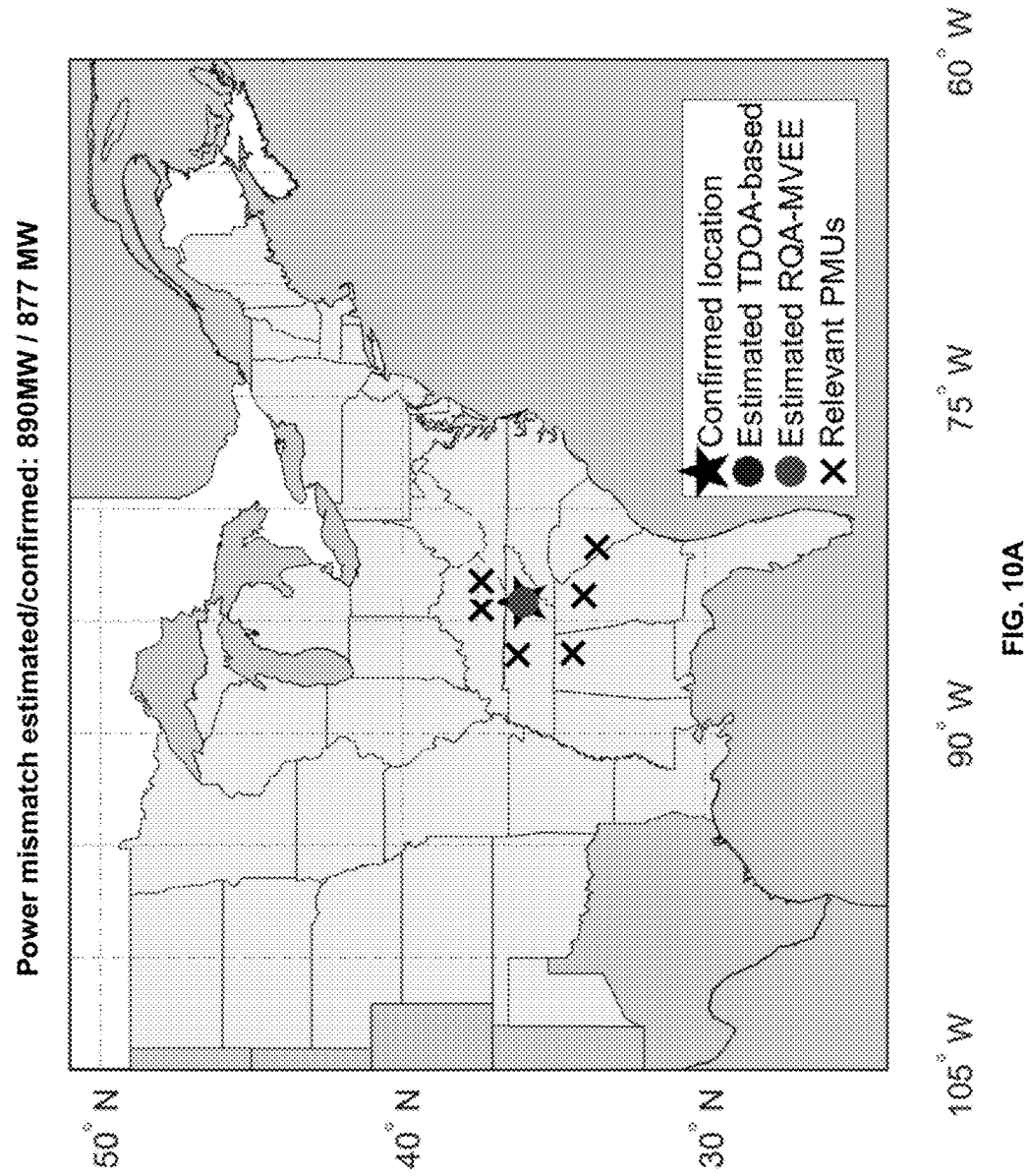
FIGS. 10A-10C illustrate disturbance locations and associated power mismatches estimated by the method in FIG. 2 and conventional methods, for three separate disturbances.
Figure 10B:
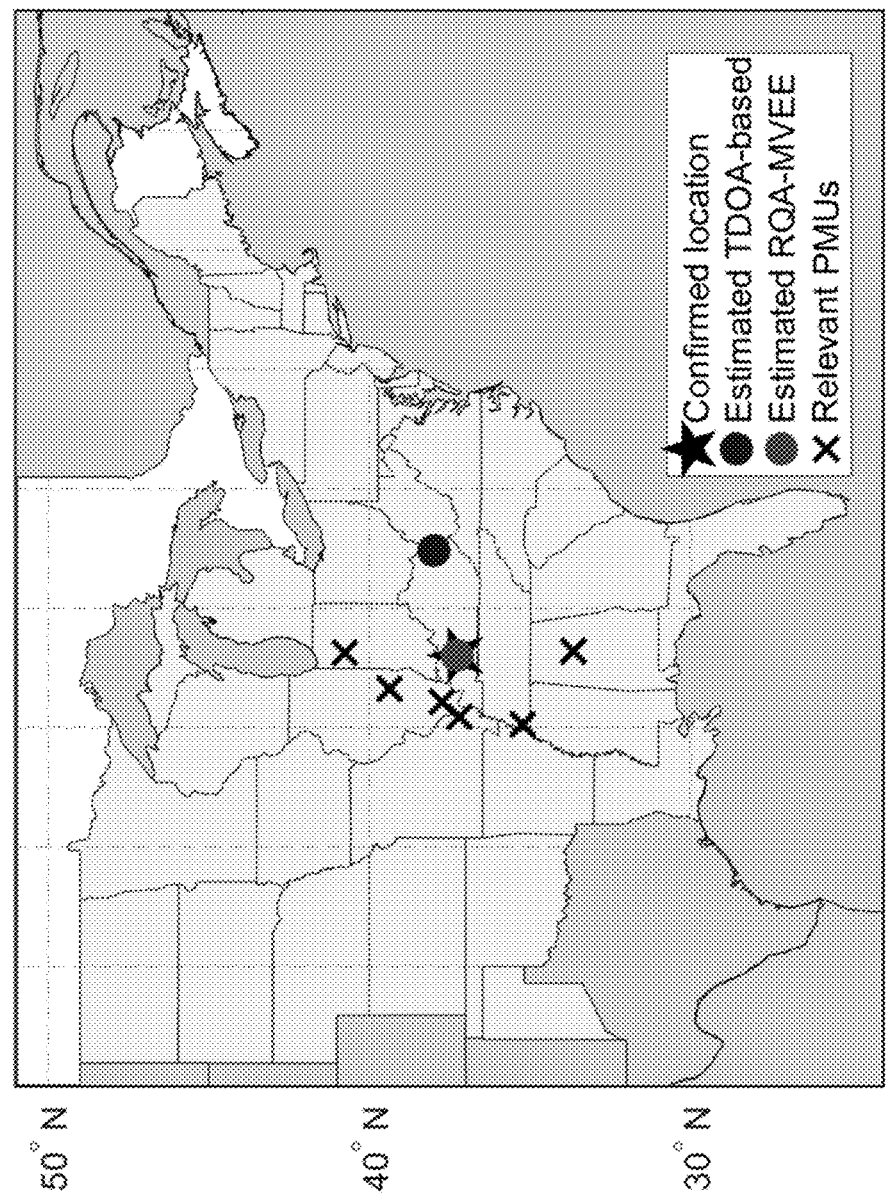
Figure 10C:
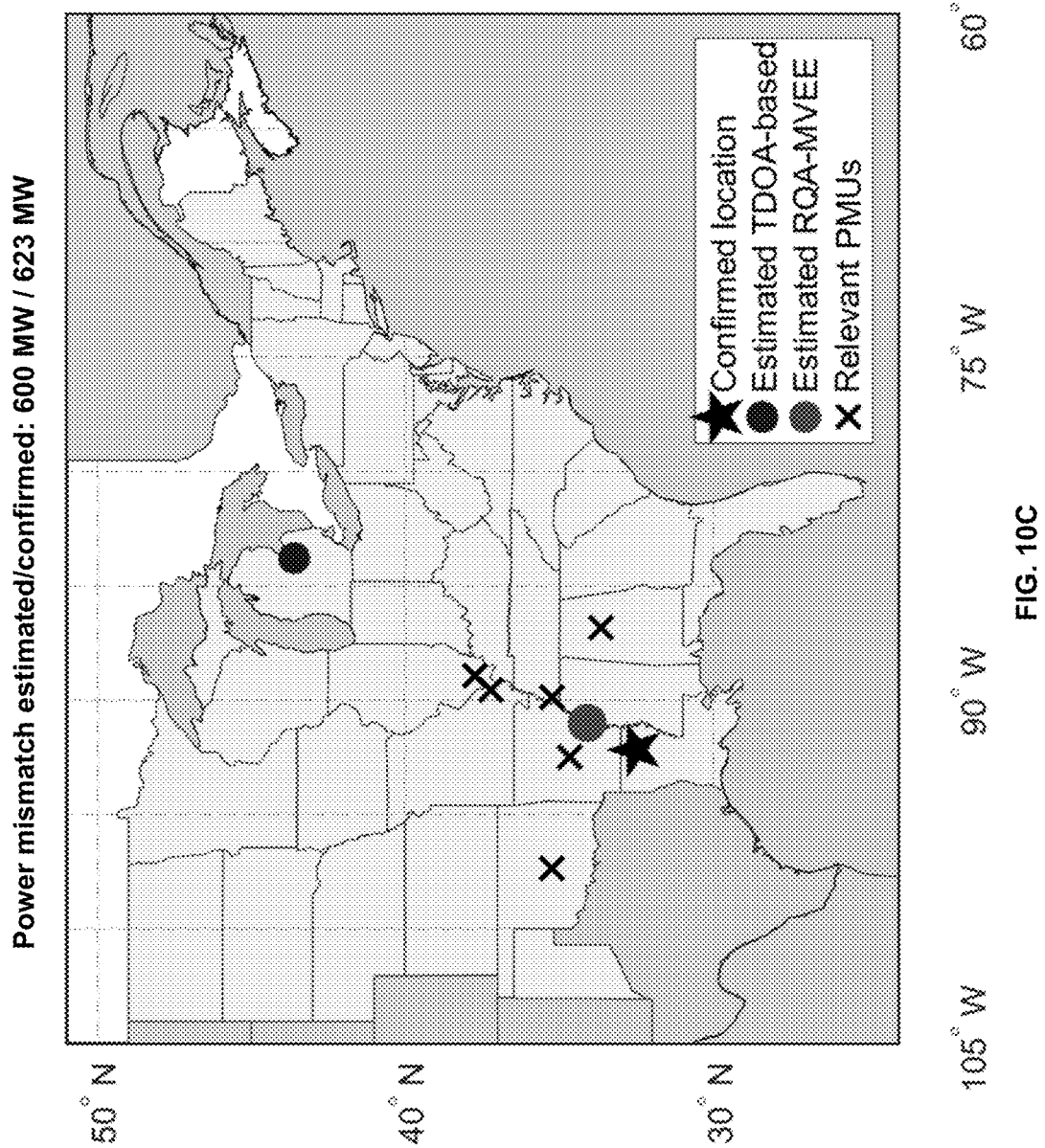

FIGS. 10A-10C illustrate disturbance locations estimated by the method 200 (RQA-MVEE) and a conventional TDOA-based method for three separate disturbances, using frequency data recorded by relevant PMUs close to the disturbances. Specifically, in FIG. 10A, both the RQA-MVEE and TDOA-based methods can correctly identify the disturbance location. This is because, as can be seen in FIG. 10A, the disturbance was closely surrounded by enough PMUs, leading to highly accurate estimations from both methods. In FIG. 10B, the RQA-MVEE method can pinpoint the exact disturbance location while the estimation of the TDOA-based method is off by about 165 miles. This demonstrates that the TDOA-based method can give relatively accurate estimation only when PMUs happen to be densely deployed around the disturbance, while the RQA-MVEE method maintains good performance even if PMUs are only sparsely deployed. This observation is further supported in FIG. 10C, where the closest PMU is 150 miles away from the disturbance. In this case, the location estimation of the TDOA-based method is much farther off than that of the RQA-MVEE method.

Table III compares statistical results of the RQA-MVEE method and the TDOA-based method. From Table III, it can be seen that, compared with TDOA-based method, the method 200 has better performance in estimating disturbance location. The RQA-MVEE method can correctly identify disturbance locations even when TDOA-based method fails, i.e., where the estimation error is above 100 miles. The RQA-MVEE method can identify more than 98% of disturbance cases with a reasonable accuracy (distance error less than 50 miles), among which approximate 70% of the power disturbances are correctly located without any error. The average distance error by the ROA-MVEE method is around 18 miles.

TABLE III

| Location estimation error (miles) | TDOA-based method | RQA-MVEE method |
|---|---|---|
| 0 | 30% | 70% |
| <50 | 50% | 98% |
| <100 | 65% | 100% |

In FIGS. 10A-10C, the power mismatch associated with each disturbance is also shown. As can be seen, the power mismatches estimated by the RQA-MVEE method is relatively close to the confirmed power mismatches. Table IV compares the cumulative distribution of power mismatch error estimated by the proposed algorithm and by a conventional beta-value-based method. From Table IV, it can be seen that the RQA-MVEE method outperforms the beta-value-based method in estimating the power mismatch. The RQA-MVEE method can estimate more than 80% of the power mismatch with good accuracy (less than 10% error), while the beta-value-based method can only estimate 45% of the power mismatch with error below 10%. This indicates that the RQA-MVEE method can be used as a good estimator of power mismatch during a disturbance.

TABLE IV

| Power Mismatch estimation error (%) | Beta value based method | RQA-MVEE method |
|---|---|---|
| <10 | 45% | 80% |
| <20 | 70% | 95% |
| <30 | 95% | 100% |

It is to be appreciated that the implementation of the method 200 is not limited to any particular programming language or execution environment, and the method 200 may be applied to any computer programming languages or logic. Also, the disturbance location determined by the method 200 may be displayed on the one or more displays at the clients 126 in FIG. 1 for review and analysis by the one or more operators of the power system. As such, in an event of a disturbance, the one or more operators may quickly (within seconds or sub-seconds) be informed of the location of the disturbance and may readily implement remedy plans to mitigate the impact of the disturbance and restore the system to a secure state. For example, knowing the location of the disturbance, the one or more operators may determine whether the disturbance involves one or more of a generator, a transmission line, a substation, etc., and may thus decide whether to control the generator, open one or more switches/breakers, etc.

Embodiments of the disclosure are specifically illustrated and/or described herein. However, it will be appreciated that modifications and variations of the disclosure are covered by the above teachings and within the purview of the appended claims without departing from the spirit and intended scope of the disclosure. Further variations that are consistent with the principles described above are permissible.

What is claimed is:

1. A method for determining a location of a disturbance in a power system, comprising:

receiving data from a plurality of sensors distributed across the power system;
identifying, based on the data from the plurality of sensors, a number of sensors that are closest to the disturbance;
constructing a plurality of minimum-volume-enclosing ellipsoids based on and enclosing the data received from the identified sensors;
extracting one or more parameters from the plurality of ellipsoids;
inputting the one or more parameters into a regression algorithm to determine the location of the disturbance; and
modifying an operation of at least one element in the power system to mitigate an impact of the disturbance on the power system based on the determined location of the disturbance.

2. The method of claim 1, wherein the data comprise frequency data.

3. The method of claim 1, wherein the identifying the number of sensors comprises performing a recurrence quantification analysis on the received data.

4. The method of claim 3, wherein the identifying the number of sensors by performing a recurrence quantification analysis on the received data comprises:
identifying, from the data, an occurrence time of the disturbance;
calculating, about the occurrence time, step changes in subsequent samples of the data;
calculating, based on the step changes, a distance matrix for each of the plurality of sensors;
calculating a space diameter based on the distance matrix for each of the plurality of sensors;
determining a recurrence rate, for each of the plurality of sensors, based on the corresponding distance matrix and the corresponding space diameter; and
identifying the number of sensors as a subset of the plurality of sensors with the highest recurrence rates.

5. The method of claim 1, wherein the one or more parameters comprise volumes of the plurality of ellipsoids, centers of the plurality of ellipsoids, orientations of the plurality of ellipsoids, time derivatives of the volumes, time derivatives of the centers, or time derivatives of the orientations.

6. The method of claim 1, wherein the regression algorithm is a multivariate-random-forest regression algorithm.

7. The method of claim 1, further comprising, prior to the inputting the one or more parameters into the regression algorithm, training the regression algorithm with historical data from the plurality of sensors.

8. The method of claim 1, wherein the inputting the one or more parameters into the regression algorithm comprises determining a power mismatch corresponding to the disturbance.

9. The method of claim 8, further comprising presenting, on one or more display units, the determined location of the disturbance and the determined power mismatch.

10. A system, comprising:
a power system;
a plurality of sensors distributed across the power system; and
a computer system including one or more processors, one or more display units, and memory storing instructions adapted to be executed by the plurality of processors to perform operations comprising:
receiving data from the plurality of sensors;
identifying, based on the data and from the plurality of sensors, a number of sensors that are closest to a disturbance in the power system;
constructing a plurality of minimum-volume-enclosing ellipsoids based on and enclosing the data received from the identified sensors;
extracting one or more parameters from the plurality of ellipsoids;
inputting the one or more parameters into a regression algorithm to determine the location of the disturbance; and
modifying an operation of at least one element in the power system to mitigate an impact of the disturbance on the power system based on the determined location of the disturbance.

11. The system of claim 10, wherein the data comprise frequency data.

12. The system of claim 10, wherein the operation of identifying the number of sensors comprises performing a recurrence quantification analysis on the received data.

13. The system of claim 12, wherein the operation of identifying the number of sensors by performing a recurrence quantification analysis on the received data comprises:
identifying, from the data, an occurrence time of the disturbance;
calculating, about the occurrence time, step changes in subsequent samples of the data;
calculating, based on the step changes, a distance matrix for each of the plurality of sensors;
calculating a space diameter based on the distance matrix for each of the plurality of sensors;
determining a recurrence rate, for each of the plurality of sensors, based on the corresponding distance matrix and the corresponding space diameter; and
identifying the number of sensors as a subset of the plurality of sensors with the highest recurrence rates.

14. The system of claim 10, wherein the one or more parameters comprise volumes of the plurality of ellipsoids, centers of the plurality of ellipsoids, orientations of the plurality of ellipsoids, time derivatives of the volumes, time derivatives of the centers, or time derivatives of the orientations.

15. The system of claim 10, wherein the regression algorithm is a multivariate-random-forest regression algorithm.

16. The system of claim 10, the operations further comprising, prior to the operation of inputting the one or more parameters into the regression algorithm, training the regression algorithm with historical data from the plurality of sensors.

17. The system of claim 10, wherein the operation of inputting the one or more parameters into the regression algorithm comprises determining a power mismatch corresponding to the disturbance.

18. The system of claim 17, wherein the operations further comprises presenting, on one or more display units, the determined location of the disturbance and the determined power mismatch.

19. A computer program product, comprising:
a tangible computer readable storage medium comprising computer readable program code embodied in the medium that when executed by a processor causes the processor to perform operations comprising:
receiving data from a plurality of sensors distributed across the power system;

identifying, based on the data from the plurality of sensors, a number of sensors that are closest to the disturbance;

constructing a plurality of minimum-volume-enclosing ellipsoids based on and enclosing the data received from the identified sensors;

extracting one or more parameters from the plurality of ellipsoids;

inputting the one or more parameters into a regression algorithm to determine the location of the disturbance; and modifying an operation of at least one element in the power system to mitigate an impact of the disturbance on the power system based on the determined location of the disturbance.

20. The computer program product of claim 19, wherein the one or more parameters comprise volumes of the plurality of ellipsoids, centers of the plurality of ellipsoids, orientations of the plurality of ellipsoids, time derivatives of the volumes, time derivatives of the centers, or time derivatives of the orientations.

* * * * *

UNITED STATES PATENT AND TRADEMARK OFFICE
CERTIFICATE OF CORRECTION

PATENT NO. : 10,371,740 B2
APPLICATION NO. : 15/609861
DATED : August 6, 2019
INVENTOR(S) : Cui et al.

It is certified that error appears in the above-identified patent and that said Letters Patent is hereby corrected as shown below:

In the Specification

Column 1, Line 61: Please correct "as in equation" to read -- as in equation (1). --

Column 2, Line 10: Please correct "$(\varphi, \chi_l)$" to read -- $(\varphi_i, \chi_i)$ --

Column 4, Line 47: Please correct "form" to read -- for $m$ --

Column 4, Line 48: Please correct "$\bar{x}_2,...m\ \bar{x}_i$," to read -- $\bar{x}_2,...,\bar{x}_i$, --

Signed and Sealed this
Twenty-sixth Day of November, 2019

Andrei Iancu
*Director of the United States Patent and Trademark Office*